United States Patent
Chiang et al.

(10) Patent No.: US 11,342,380 B2
(45) Date of Patent: May 24, 2022

(54) MEMORY DEVICES WITH SELECTOR LAYER AND METHODS OF FORMING THE SAME

(71) Applicant: Taiwan Semiconductor Manufacturing Co., Ltd., Hsinchu (TW)

(72) Inventors: Hung-Li Chiang, Taipei (TW); Jung-Piao Chiu, Kaohsiung (TW); Tzu-Chiang Chen, Hsinchu (TW); Yu-Sheng Chen, Taoyuan (TW); Xinyu Bao, Fremont, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 21 days.

(21) Appl. No.: 16/885,231

(22) Filed: May 27, 2020

(65) Prior Publication Data
US 2021/0375989 A1    Dec. 2, 2021

(51) Int. Cl.
*H01L 27/24* (2006.01)
*H01L 45/00* (2006.01)

(52) U.S. Cl.
CPC .......... *H01L 27/2427* (2013.01); *H01L 45/08* (2013.01); *H01L 45/1233* (2013.01); *H01L 45/1253* (2013.01); *H01L 45/1608* (2013.01); *H01L 45/142* (2013.01); *H01L 45/143* (2013.01); *H01L 45/144* (2013.01)

(58) Field of Classification Search
CPC . H01L 27/2427; H01L 45/08; H01L 45/1233; H01L 45/1608; H01L 45/1253; H01L 45/142; H01L 45/143; H01L 45/144
See application file for complete search history.

(56) References Cited

U.S. PATENT DOCUMENTS

| | | | |
|---|---|---|---|
| 9,246,092 B1* | 1/2016 | Bodke | H01L 45/00 |
| 2015/0097187 A1* | 4/2015 | Govoreanu | H01L 45/00 257/52 |
| 2016/0329491 A1* | 11/2016 | Ha | G06F 12/0802 |
| 2020/0075676 A1* | 3/2020 | Salahuddin | H01L 43/10 |
| 2020/0161372 A1* | 5/2020 | Beckmann | H01L 45/1253 |
| 2021/0151672 A1* | 5/2021 | Venkatesan | H01L 27/2409 |

* cited by examiner

*Primary Examiner* — Jerome Leboeuf
(74) *Attorney, Agent, or Firm* — JCIPRNET (57) ABSTRACT

A memory device includes a memory cell, a selector layer and a first work function metal layer. The selector layer is disposed between a first electrode and a second electrode over the memory cell. The first work function metal layer is disposed between the selector layer and the first electrode.

20 Claims, 5 Drawing Sheets

MEMORY DEVICES WITH SELECTOR LAYER AND METHODS OF FORMING THE SAME

BACKGROUND

In integrated circuit (IC) devices, resistive random access memory (RRAM) is a technology for non-volatile memory devices. Generally, RRAM use a dielectric material, which although normally insulating, can be made to conduct through a filament or conduction path formed after the application of a specific voltage. Once the filament is formed, it may be set (i.e., re-formed, resulting in a lower resistance across the RRAM) or reset (i.e., broken, resulting in a high resistance across the RRAM) by applying appropriate voltages. The low and high resistance states can be utilized to indicate a digital signal of "1" or "0" depending upon the resistance state, and thereby provide a non-volatile memory cell that can store a bit.

From an application point of view, RRAM has many advantages. RRAM has a simple cell structure and CMOS logic comparable processes, which result in a reduction of the manufacturing complexity and cost in comparison with other non-volatile memory structures. Despite the attractive properties noted above, a number of challenges exist.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
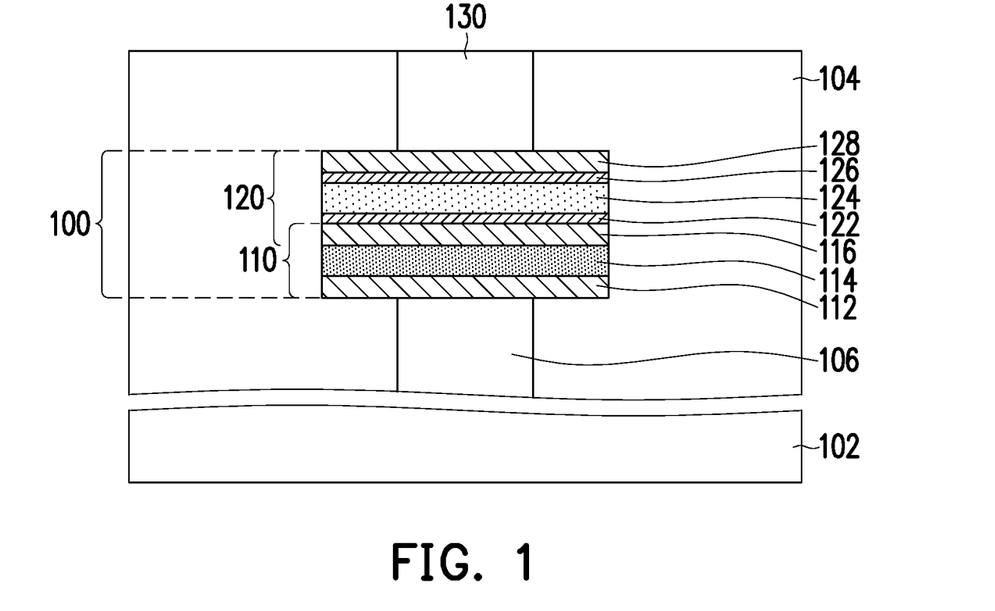
FIG. 1 illustrates a cross-sectional view of some embodiments of a memory device.

FIG. 1 illustrates a cross-sectional view of some embodiments of a memory device.

Referring to FIG. 1, a memory device 100 includes a memory cell 110 and a selector 120. In some embodiments, the memory cell 110 is surrounded by an inter-level dielectric (ILD) structure 104 arranged over a substrate 102. The substrate 102 may be any type of semiconductor body such as a semiconductor wafer and/or one or more die on a wafer, as well as any other type of semiconductor and/or epitaxial layers, associated therewith. The semiconductor body may include silicon, SiGe, SOI, or the like. The ILD structure 104 may be a single layered or multiple layered structure, and include silicon oxide ($SiO_2$), silicon oxynitride (SiON), silicon nitride (SiN), silicon carbide (SiC), or the like.

The memory cell 110 includes a first electrode 112, a dielectric data storage layer 114, and a second electrode 116. The first electrode 112 is separated from the substrate 102 by one or more first interconnect layers 106. The first interconnect layer 106 may be a metal via and/or a metal wire. In some embodiments, the first interconnect layer 106 is electrically coupled to underlying electric components, such as a transistor, a resistor, a capacitor, a selector, and/or a diode. The dielectric data storage layer 114 is arranged over the first electrode 112, and the second electrode 116 is disposed between the dielectric data storage layer 114 and a second interconnect layer 130. The second interconnect layer 130 may be a metal via and/or a metal wire.

In some embodiments, the memory cell 110 is a RRAM cell and is configured to store data by a resistance of the dielectric data storage layer 114. In some embodiments, the dielectric data storage layer 114 having a variable resistance is configured to store data states by undergoing reversible changes between a high resistance state associated with a first data state (e.g., a '0') and a low resistance state associated with a second data state (e.g., a '1'). For example, to achieve a low resistance state within the dielectric data storage layer 114, a first set of bias conditions may be applied to the first electrode 112 and the second electrode 116. The first set of bias conditions drive oxygen from dielectric data storage layer 114 to the second electrode 116, thereby forming conductive filaments of oxygen vacancies across the dielectric data storage layer 114. Alternatively, to achieve a high resistance state within the dielectric data storage layer 114, a second set of bias conditions may be applied to the first electrode 112 and the second electrode 116. The second set of bias conditions break the conductive filaments by driving oxygen from the second electrode 116 to the dielectric data storage layer 114.

In some alternative embodiments, the dielectric data storage layer 114 is replaced with some other suitable data storage structure, such that the memory cell 110 is another type of memory cell. For example, the memory cell 110 may be a phase change memory (PCM) cell, a magnetoresistive random-access memory (MRAM) cell, a conductive-bridging random-access memory (CBRAM) cell, or some other suitable memory cell.

In some embodiments, the first electrode 112 may be or include titanium nitride (TiN), titanium tungsten (TiW), titanium tungsten nitride (TiWN), titanium tantalum nitride (TiTaN), tantalum nitride (TaN), tungsten (W), tungsten nitride (WN), hafnium nitride (HfN), tungsten titanium (WTi), tungsten titanium nitride (WTiN), hafnium tungsten nitride (HfWN), hafnium tungsten (HfW), titanium hafnium nitride (TiHfN), or the like. In some embodiments, the second electrode 116 may be or include titanium nitride (TiN), titanium tungsten (TiW), titanium tungsten nitride (TiWN), titanium tantalum nitride (TiTaN), tantalum nitride (TaN), tungsten (W), tungsten nitride (WN), hafnium nitride (HfN), tungsten titanium (WTi), tungsten titanium nitride (WTiN), hafnium tungsten nitride (HfWN), hafnium tungsten (HfW), titanium hafnium nitride (TiHfN), or the like. In some embodiments, the second electrode 116 and the first electrode 112 are the same material. In some alternative embodiments, the second electrode 116 and the first electrode 112 have different materials.

The selector 120 overlies the memory cell 110. In some embodiments, the selector 120 and the memory cell 110 form a one-selector one-memory cell (1S1MC) stack. The selector 120 includes the second electrode 116, a first work function metal layer 122, a selector layer 124, a second work function metal layer 126 and a third electrode 128. The selector layer 124 is disposed over the second electrode 116, and the third electrode 128 is disposed between the selector layer 124 and the second interconnect layer 130. The second interconnect layer 130 is disposed over and electrically coupled to the third electrode 128. The second interconnect layer 130 is electrically coupled to overlying metal wires.

The selector layer 124 is configured to switch between a low resistance state and a high resistance state depending on whether a voltage applied across the selector 120 is greater than a threshold voltage. In some embodiments, the selector 120 may be a threshold-type selector. For example, the selector 120 may have a high resistance state if a voltage across the selector 120 is less than the threshold voltage, and the selector 120 may have a low resistance state if a voltage across the selector 120 is greater than the threshold voltage. In some embodiments, an electron affinity (the energy from vacuum level to conduction band) of the selector layer 124 is in a range of about 3.5 eV to about 4.5 eV. The selector layer 124 may include a chalcogenide material such as CdS, $Ce_2S_3$, $CuInS_2$, $CuIn_5S_8$, $In_2S_3$, PbS, $Sb_2S_3$, ZnS, CdSe, CdTe, $Sb_2Se_3$, a combination thereof or the like. In some embodiments, the selector layer 124 includes an ovonic threshold switch (OTS) material or a voltage conductive bridge (VCB) material. The OTS material may include a binary material such as SiTe, GeTe, CTe, BTe, ZnTe, AlTe, GeSe, GeSb, SeSb, SiAs, GeAs, AsTe and BC, a ternary material such as GeSeAs, GeSeSb, GeSbTe, GeSiAs, GeAsSb, SeSbTe and SiTeSe, or a quadruple material such as GeSeAsTe, GeSeTeSi, GeSeTeAs, GeTeSiAs, GeSeAsSb and GeSeSbSi. The binary material may be doped with N, O or the like, and the ternary material and the quadruple material may be doped with N, O, C or the like. The VCB material may include at least one metal and at least one oxide, the at least one metal may be selected from Ag, Cu, Al, As, Te and the like, and the oxide may be $SiO_2$, $TiO_2$, $Al_2O_3$, $TaO_2$, $ZrO_2$, a combination thereof or the like.

In some embodiments, the third electrode 128 may be or include titanium nitride (TiN), titanium tungsten (TiW), titanium tungsten nitride (TiWN), titanium tantalum nitride (TiTaN), tantalum nitride (TaN), tungsten (W), tungsten nitride (WN), hafnium nitride (HfN), tungsten titanium (WTi), tungsten titanium nitride (WTiN), hafnium tungsten nitride (HfWN), hafnium tungsten (HfW), titanium hafnium nitride (TiHfN), or the like. In some embodiments, the third electrode 128 and the second electrode 116 are the same material. In some alternative embodiments, the third electrode 128 and the second electrode 116 have different materials.

In some embodiments, the first work function metal layer 122 is disposed between the selector layer 124 and the second electrode 116, and the second work function metal layer 126 is disposed between the selector layer 124 and the third electrode 128. In some embodiments, the first work function metal layer 122 is directly disposed on the selector layer 124, that is, the first work function metal layer 122 is in direct contact with the selector layer 124. Similarly, the second work function metal layer 126 is directly disposed under the selector layer 124, and the second work function metal layer 126 is in direct contact with the selector layer 124. In some embodiments, a band offset between an electron affinity of the selector layer 124 and a work function of the first work function metal layer 122 is in a range of about 0.2 eV to about 0.5 eV. A band offset between an electron affinity of the selector layer 124 and a work function of the second work function metal layer 126 is in a range of about 0.2 eV to about 0.5 eV. For example, a work function of the first work function metal layer 122 and the second work function metal layer 126 is respectively in a range of about 4.0 eV to about 5.6 eV while an electron affinity energy (Ec) of the selector layer 124 is in a range of about 3.5 eV to about 4.5 eV. Thus, a material of the first work function metal layer 122 and the second work function metal layer 126 is selected based on a material of the selector layer 124. In some embodiments, the first work function metal layer 122 and the second work function metal layer 126 may include Al, Mn, Zr, Bi, Pb, Ta, Ag, V, Zn, Ti, Nb, Sn, W, Cr, Fe, TiN, Mo, Cu, Ru, Sb, Os, Te, Re, Rh, Be, Co, TiN, TaN, Ta/Si/N, Ti/Si/N, Au, Pd, Ni, Pt or a combination thereof.

Figure 2A:
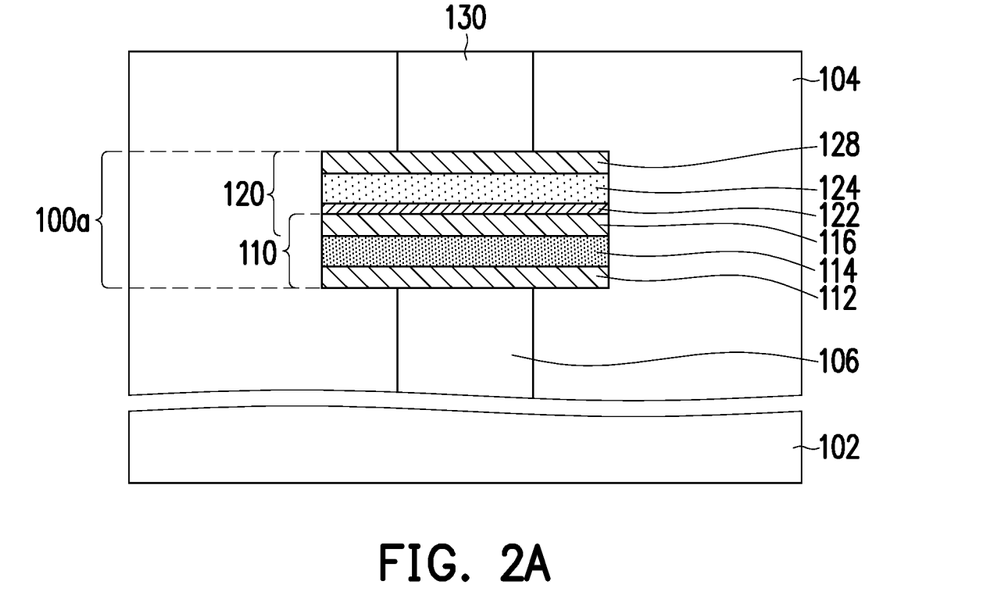
FIGS. 2A and 2B respectively illustrate a cross-sectional view of some embodiments of a memory device.
Figure 2B:
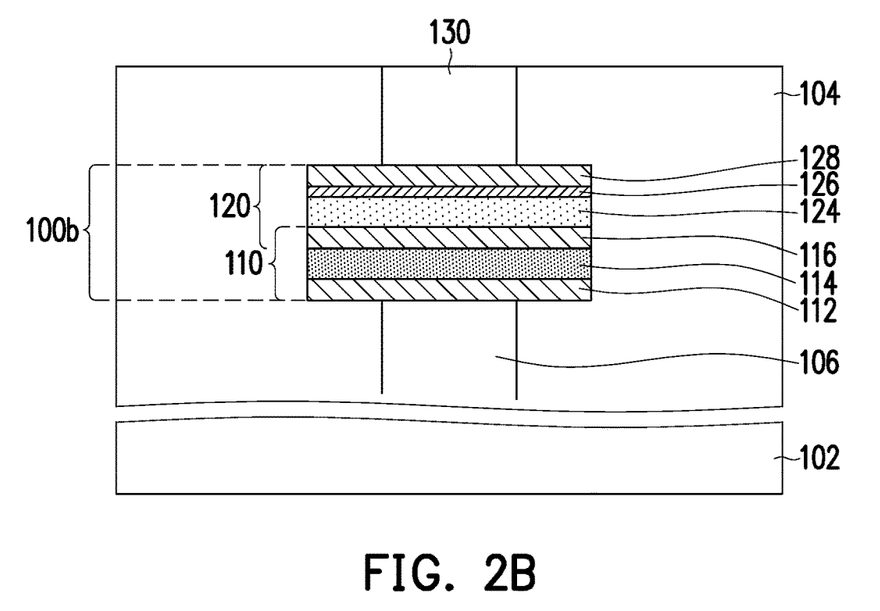

In some embodiments, a thickness of the selector layer 124 is larger than a thickness of the first work function metal layer 122 and the second work function metal layer 126. A thickness of the selector layer 124 may be in a range of about 10 urn to about 50 nm, and a thickness of the first work function metal layer 122 and the second work function metal layer 126 may be in a range of about 1 nm to about 5 nm. In some embodiments, the first work function metal layer 122 and the second work function metal layer 126 may be respectively a single layer. However, the disclosure is not limited thereto. In some alternative embodiments, at least one of the first work function metal layer 122 and the second work function metal layer 126 may be a multiple layered structure. That is, the first work function metal layer 122 and/or the second work function metal layer 126 may include a plurality of layers. In the multiple layered structure of the work function metal layer, a work function of the layer may increase as the layer becomes closer to the selector layer 124, and a thickness of the layer may decrease as the layer becomes closer to the selector layer 124. In some embodiments, the first work function metal layer 122 and the second work function metal layer 126 are disposed on opposite sides of the selector layer 124, in other words, the selector 120 has a bi-polar element. However, the disclosure is not limited thereto. In some alternative embodiments, as shown in FIGS. 2A and 2B, in the memory device 100a, 100b, the work function metal layer (e.g., the first work function metal layer 122 or the second work function metal layer 126) is disposed at only one side of the selector layer 124, in other words, the selector 120 has an uni-polar element. In addition, in above embodiments, the memory cell 110 is disposed under the selector 120. However, the disclosure is not limited thereto. In some alternative embodiments, the memory cell 110 is disposed above the selector 120. For example, the selector 120 is disposed between the memory cell 110 and the first interconnect layer 106, and the selector 120 is electrically coupled to the first interconnect layer 106. The memory cell 110 may be disposed between the second interconnect layer 130 and the selector 120, and the memory cell 110 may be electrically coupled to the second interconnect layer 130.

In some embodiments, a width of the first electrode 112, the dielectric data storage layer 114, the second electrode 116, the first work function metal layer 122, the first barrier layer 123, the selector layer 124, the second barrier layer 125, the second work function metal layer 126 and the third electrode layer 128 is substantially the same. However, the disclosure is not limited thereto. In some alternative embodiments, the width of the first electrode 112, the dielectric data storage layer 114, the second electrode 116, the first work function metal layer 122, the first barrier layer 123, the selector layer 124, the second barrier layer 125, the second work function metal layer 126 and the third electrode layer 128 may be different.

In some embodiments, a word line (WL) or a word plane extending along a first direction is electrically coupled to one end of the memory device 100-100b (for example, through the third electrode 128 and the second interconnect layer 130), and a bit line (BL) extending along a second direction substantially perpendicular to the first direction is electrically coupled to an opposite end of the memory device 100-100b (for example, through the first electrode 112 and the first interconnect layer 106). Consequently, by providing suitable bias conditions, the memory cell 110 can be switched between two states of electrical resistance, a first state with a low resistance and a second state with a high resistance, to store data.

It is known that the threshold-type selector blocks the off-state current by its thickness and a barrier height. However, for aggressive scaled memory array, the total thickness of the selector should be reduced, which will increase the off-state current too much. In some embodiments, the work function metal layer is disposed between the selector layer and the electrode of the selector. The work function metal layer is configured to provide certain work function with respect to the electron affinity of the selector layer. Therefore, when the selector is turned on, carriers go through the work function metal layer by FN (Fowler Nordheim) tunneling, which will not increase the on-state resistance of the selector significantly. Accordingly, performance such as stability and reliability of the memory device may be improved by reducing the subthreshold leakage of the selector and thereby reducing the off-state current of the memory cell.

Figure 3:
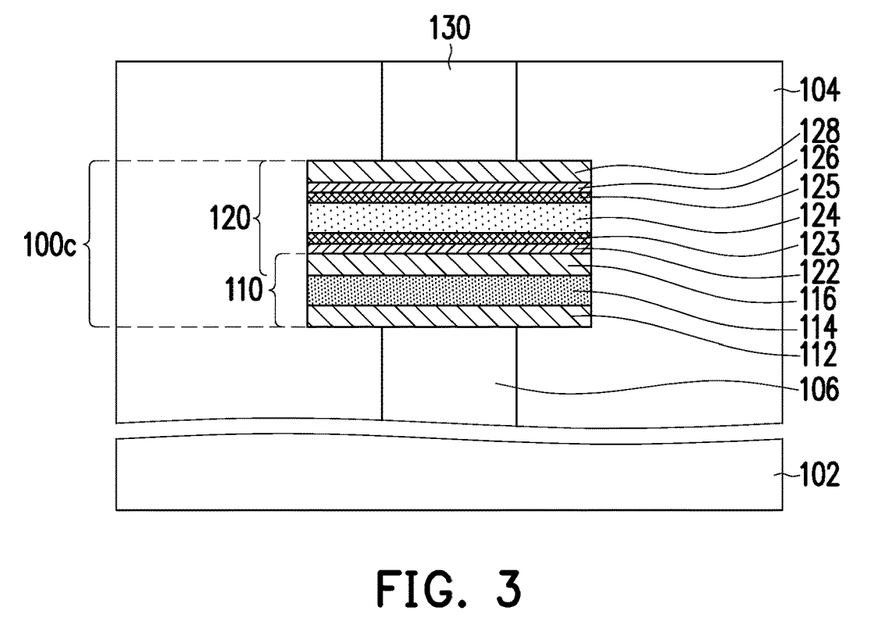
FIG. 3 illustrates a cross-sectional view of some embodiments of a memory device.

FIG. 3 illustrates a cross-sectional view of some embodiments of a memory device. The arrangement and material of the memory device 100c are similar to the arrangement and material of the memory device 100 and thus details thereof are omitted herein. A main difference between the memory device 100c and the memory device 100 lies in that the selector 120 of the memory device 100c has at least one barrier layer between the work function metal layer and the selector layer. In some embodiments, the selector 120 has a first barrier layer 123 between the first work function metal layer 122 and the selector layer 124 and a second barrier layer 125 between the second work function metal layer 126 and the selector layer 124. In some embodiments, the first barrier layer 123 and the second barrier layer 125 are respectively in direct contact with the selector layer 124.

In some embodiments, a band offset between an electron affinity of the selector layer 124 and a conduction band of the first barrier layer 123 is in a range of about 0.2 eV to about 0.5 eV. A band offset between an electron affinity of the selector layer 124 and a conduction band of the second barrier layer 125 is in a range of about 0.2 eV to about 0.5 eV. An energy offset between the conduction band of the first barrier layer 123 and the Fermi level of the first work function metal layer 122 is in a range of about 0.2 eV to about 0.5 eV. An energy offset between the conduction band of the second barrier layer 125 and the Fermi level of the second work function metal layer 126 is in a range of about 0.2 eV to about 0.5 eV. For example, a conduction band of the first barrier layer 123 and the second barrier layer 125 is respectively in a range of about 3.0 eV to about 4.0 eV while an electron affinity of the selector layer 124 is in a range of about 3.5 eV to about 4.5 eV and a work function of the first work function metal layer 122 and the second work function metal layer 126 is in a range of about 3.5 eV to about 4.5 eV. For example, the first barrier layer 123 and the second barrier layer 125 includes $CaF_2O_4$, $Ce_2O_3$, $Cu_2O$, $In_2O_3$, $LaTi_2O_7$, NiO, $SrTiO_3$, $Ta_2O_5$, $TiO_2$, ZnO, $ZrO_2$, $CaFe_2O_4$, $YFeO_3$, $Bi_4Ti_3O_{12}$, $K_4Nb_6O_{17}$, $Nb_2O_5$, $Bi_2Moa_4$, $BiVO_4$, $InVO_4$, $BaTiO_3$ or a combination thereof. The material of the first barrier layer 123 is different from the material of the first work function metal layer 122, and the material of the second barrier layer 125 is different from the material of the second work function metal layer 126. The material of the first barrier layer 123 may be the same as or different from the material of the second barrier layer 125. In some embodiments, a thickness of the selector layer 124 is larger than a thickness of the first work function metal layer 122 and the second work function metal layer 126 respectively. A thickness of the selector layer 124 may be in a range of about 10 nm to about 50 nm, and a thickness of the first work function metal layer 122 and the second work function metal layer 126 may be in a range of about 1 nm to about 5 nm. In some embodiments, the first barrier layer 123 and the second barrier layer 125 may be respectively a single layer. However, the disclosure is not limited thereto. In some alternative embodiments, at least one of the first barrier layer 123 and the second barrier layer 125 may be a multiple layered structure. That is, the first barrier layer 123 and/or the second barrier layer 125 may include a plurality of layers. In the multiple layered structure of the barrier layer, a work function of the layer may increase as the layer becomes closer to the selector layer 124, and a thickness of the layer may decrease as the layer becomes closer to the selector layer 124.

Figure 4A:
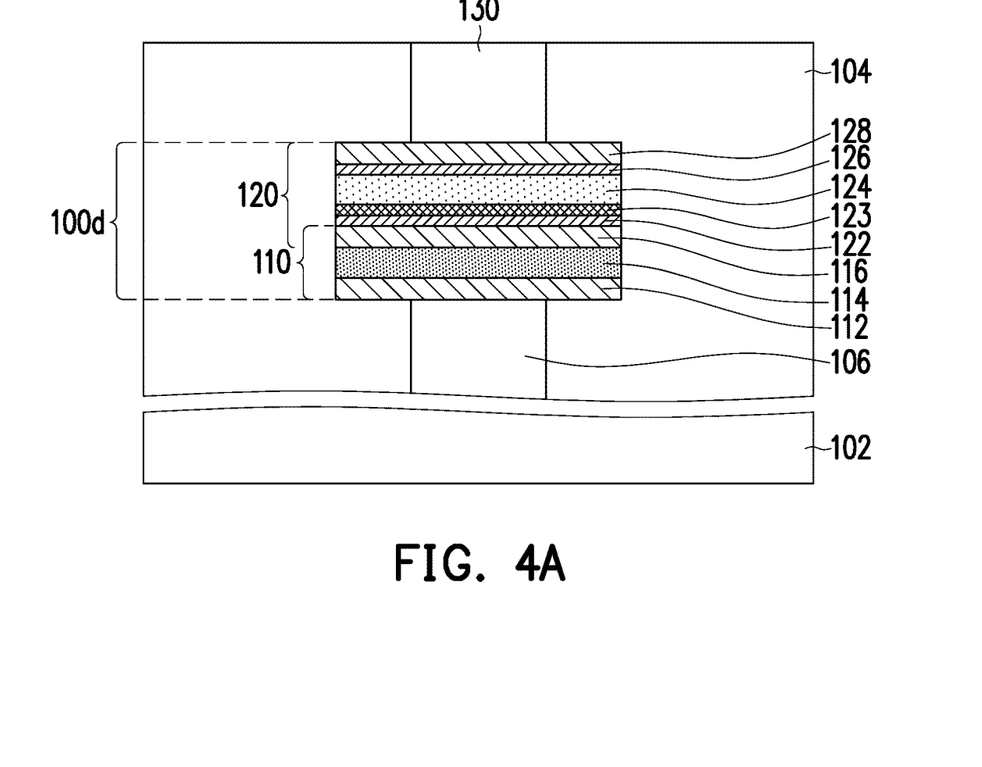
FIGS. 4A and 4B respectively illustrate a cross-sectional view of some embodiments of a memory device.
Figure 4B:
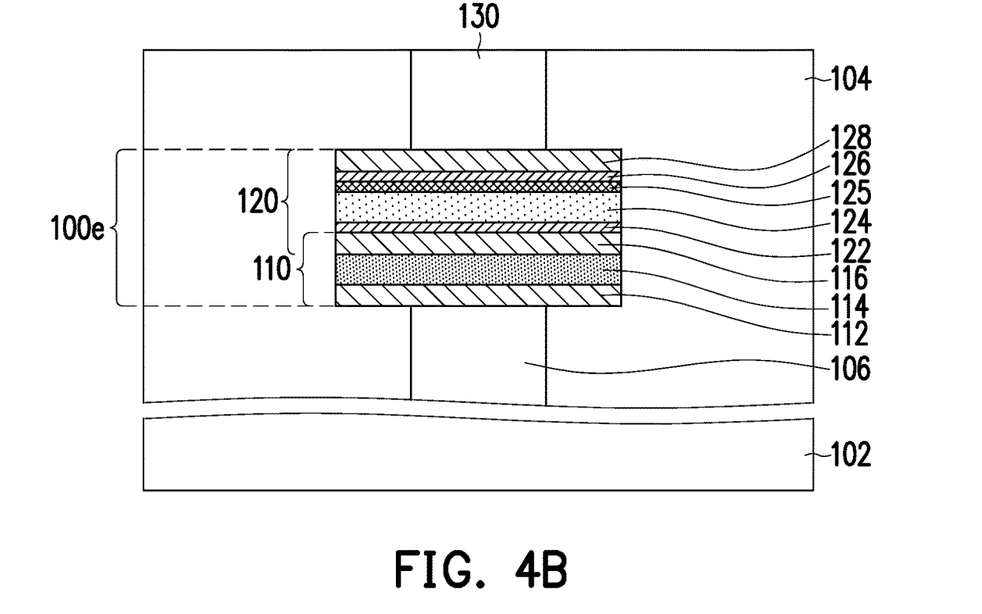

In some embodiments, the first work function metal layer 122 and the first barrier layer 123 and the second work function metal layer 126 and the second barrier layer 125 are disposed on opposite sides of the selector layer 124, in other words, the selector 120 has a bi-polar element. However, the disclosure is not limited thereto. In some alternative embodiments, as shown in FIG. 4A, in the memory device 100d, the first work function metal layer 122 and the first barrier layer 123 are disposed at only one side of the selector layer 124, in other words, the selector 120 has an uni-polar element. Similarly, as shown in FIG. 4B, in the memory device 100e, the second work function metal layer 126 and the second barrier layer 125 are disposed at only one side of the selector layer 124. In addition, in above embodiments, the memory cell 110 is disposed under the selector 120. However, the disclosure is not limited thereto. In some alternative embodiments, the memory cell 110 is disposed above the selector 120. For example, the selector 120 is disposed between the memory cell 110 and the first interconnect layer 106, and the selector 120 is electrically coupled to the first interconnect layer 106. The memory cell 110 may be disposed between the second interconnect layer 130 and the selector 120, and the memory cell 110 may be electrically coupled to the second interconnect layer 130.

In some embodiments, the barrier layer is disposed between the selector layer and the work function metal layer of the selector. The barrier layer is configured to provide certain conduction band with respect to the electron affinity of the selector layer. Therefore, when the selector is turned on, carriers go through the barrier layer by FN (Fowler Nordheim) tunneling, which will not increase the on-state resistance of the selector significantly. Accordingly, performance such as stability and reliability of the memory device may be improved by reducing the subthreshold leakage of the selector and thereby reducing the off-state current of the memory cell.

FIGS. 5A to 5D illustrate cross-sectional views of some embodiments of a method of forming a memory device. Although the cross-sectional views shown in FIGS. 5A to 5D are described with reference to a method, it will be appreciated that the structures shown in FIGS. 5A to 5D are not limited to the method but rather may stand alone separate of the method. Although FIGS. 5A to 5D are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5A:
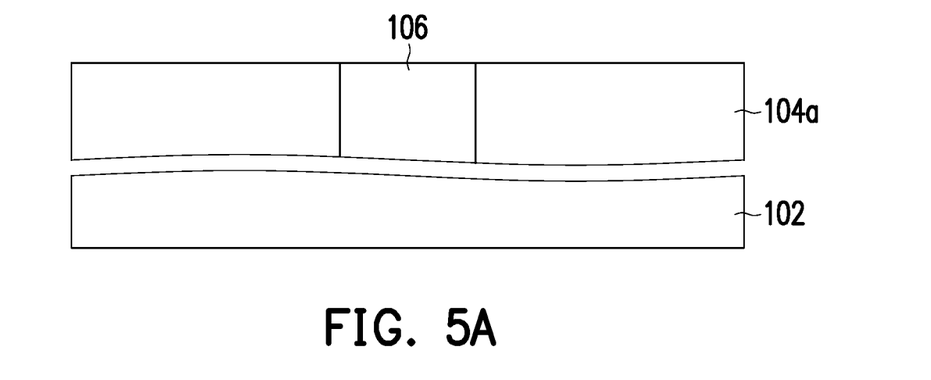
FIGS. 5A to 5D illustrate cross-sectional views of some embodiments of a method of forming a memory device.

Referring to FIG. 5A, a first interconnect layer 106 is formed within a first inter-level dielectric (ILD) layer 104a over a substrate 102. The first ILD layer 104a may include an oxide, a low-k dielectric, or an ultra low-k dielectric. In some embodiments, the first interconnect layer 106 may be formed by selectively etching the first ILD layer 104a to define an opening within the first ILD layer 104a. A metal such as copper and aluminum is then deposited to fill the opening, and a planarization process such as a chemical mechanical planarization process is performed to remove excess metal.

Figure 5B:
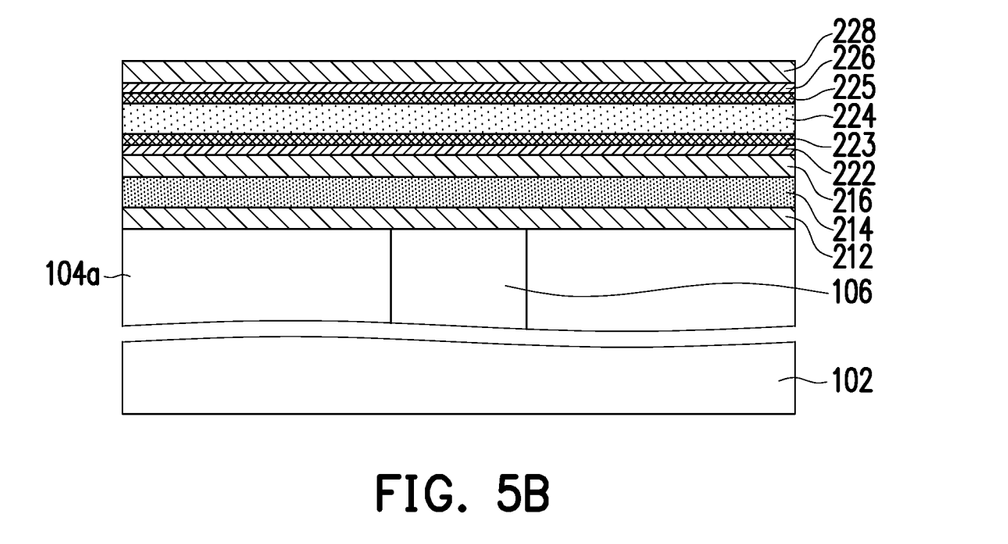

Referring to FIG. 5B, a first electrode film 212, a dielectric data storage film 214, a second electrode film 216, a first work function metal film 222, a first barrier film 223, a selector film 224, a second barrier film 225, a second work function metal film 226 and a third electrode film 228 are sequentially formed over the first interconnect layer 106 and the first ILD layer 104a. In some embodiments, the above layers may be formed using a deposition process such as, for example, CVD, PVD, PE-CVD, sputtering, ALD, some other suitable deposition process(es), or any combination of the foregoing. In some alternative embodiments, in the method of forming the memory device 100, 100a, 100b, 100d, 100e of FIGS. 1, 2A, 2B, 4A and 4B, at least one of the first work function metal film 222, the second work function metal film 226, the first barrier film 223 and the second barrier film 225 may be omitted.

Figure 5C:
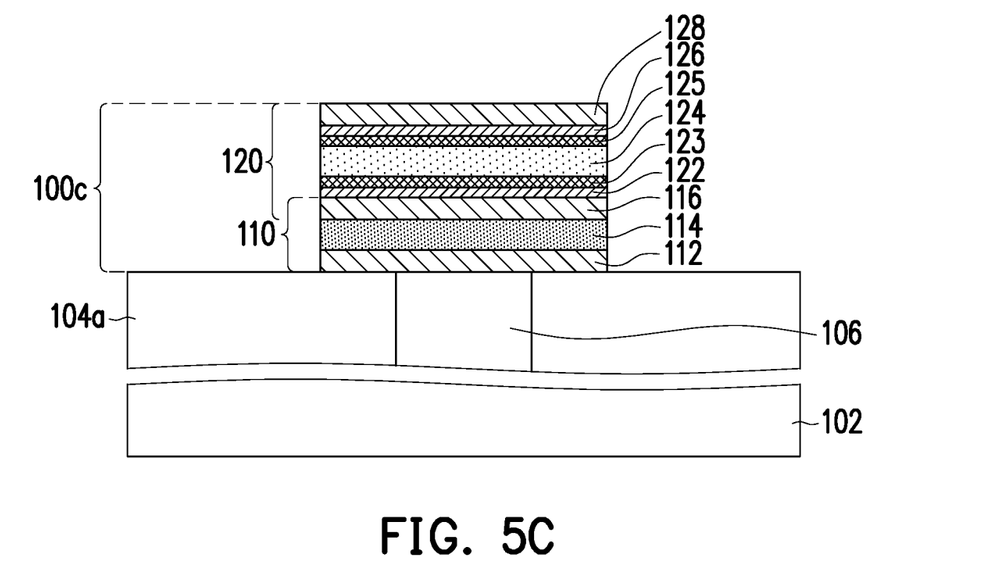

Referring to FIG. 5C, a patterning process is performed to form a first electrode 112, a dielectric data storage layer 114, a second electrode 116, a first work function metal layer 122, a first barrier layer 123, a selector layer 124, a second barrier layer 125, a second work function metal layer 126 and a third electrode layer 128. In some embodiments, a memory cell 110 and a selector 120 is formed after the patterning process. In some embodiments, the patterning process includes forming a masking layer (not shown) over the third electrode film 228. In some embodiments, the masking layer may include silicon-oxide ($SiO_2$), silicon-oxynitride (SiON), silicon-nitride (SiN) silicon-carbide (SiC), or a similar material. The substrate is then exposed to an etchant, configured to define the memory cell and the selector by selectively removing unmasked parts of the first electrode film 212, the dielectric data storage film 214, the second electrode film 216, the first work function metal film 222, the first barrier film 223, the selector film 224, the second barrier film 225, the second work function metal film 226 and the third electrode film 228. In some embodiments, the etchant may include a dry etchant or a wet etchant. In some alternative embodiments, according to the requirements, the first electrode film 212, the dielectric data storage film 214, the second electrode film 216, the first work function metal film 222, the first barrier film 223, the selector film 224, the second barrier film 225, the second work function metal film 226 and the third electrode film 228 may be patterned separately or some of them may be patterned simultaneously.

Figure 5D:
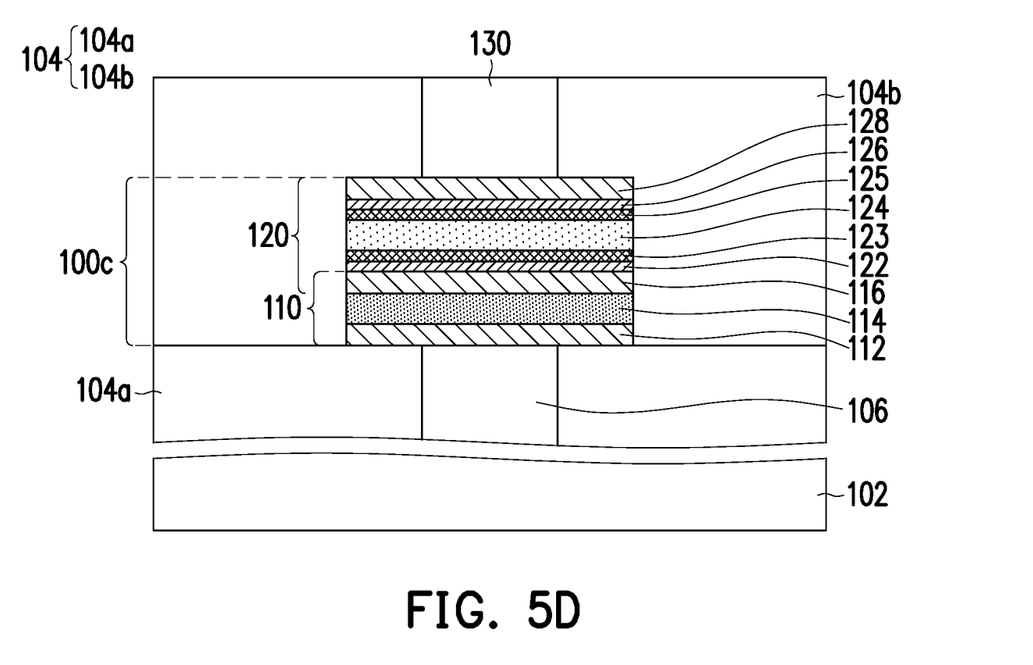

Referring to FIG. 5D, a second ILD layer 104b is formed over the memory device 100. In some embodiments, the second ILD layer 104b directly contacts sidewalls of the memory cell 110 and the selector 120 and covers a portion of the third electrode film 228. Then, a second interconnect layer 130 is formed within the second ILD layer 104b. The second ILD layer 104b may, for example, be formed by CVD, PVD, some other suitable deposition process(es), or any combination of the foregoing. In some embodiments, the second interconnect layer 130 may be formed by selectively etching the second ILD layer 104b to define an opening within the second ILD layer 104b. A metal such as copper and aluminum is then deposited to fill the opening, and a planarization process such as a chemical mechanical planarization process is performed to remove excess metal. Then, the memory device 100 of FIG. 3 is formed.

The present disclosure relates to a RRAM device having an inserted selector including a work function metal layer and/or a barrier layer. The work function metal layer and the barrier layer are configured to provide certain electron affinity and work function, so as to reduce the subthreshold leakage of the threshold-type selector. Therefore, the off-state current of the RRAM device is reduced and a reliability of the RRAM device can be improved.

According to some embodiments, a memory device includes a memory cell, a selector layer and a first work function metal layer. The selector layer is disposed between a first electrode and a second electrode over the memory cell. The first work function metal layer is disposed between the selector layer and the first electrode.

According to some embodiments, a memory device includes a first electrode, a dielectric data storage layer, a second electrode, a selector layer, a third electrode and a first work function metal layer. The dielectric data storage layer is disposed over the first electrode. The second electrode is disposed over the dielectric data storage layer. The selector layer is disposed over the second electrode. The third electrode is disposed over the selector layer. The first work function metal layer is disposed between the selector layer and one of the second electrode and the third electrode.

According to some embodiments, a method of forming a memory device includes: forming a first electrode; forming a dielectric data storage layer over the first electrode; forming a second electrode over the dielectric data storage layer; forming a selector layer over the second electrode; forming a third electrode over the selector layer; and forming a first work function metal layer between the selector layer and one of the second electrode and the third electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a memory cell;
   a selector layer, disposed between a first electrode and a second electrode over the memory cell; and
   a first work function metal layer, disposed between the selector layer and the first electrode, wherein the first work function metal layer comprises a plurality of layers, and a work function of the layer increases as the layer becomes closer to the selector layer.

2. The memory device of claim 1, wherein a band offset between an electron affinity of the selector layer and a work function of the first work function metal layer is in a range of about 0.2 eV to about 0.5 eV.

3. The memory device of claim 1, wherein a work function of the first work function metal layer is in a range of about 4.0 eV to about 5.6 eV while an electron affinity of the selector layer is in a range of about 3.5 eV to about 4.5 eV.

4. The memory device of claim 1, wherein the first work function metal layer includes Al, Mn, Zr, Bi, Pb, Ta, Ag, V, Zn, Ti, Nb, Sn, Cr, Fe, Mo, Cu, Ru, Sb, Os, Te, Re, Rh, Be, Co, TaN, Ta/Si/N, Ti/Si/N, Au, Pd, Ni, Pt or a combination thereof.

5. The memory device of claim 1, wherein a thickness of the selector layer is in a range of about 10 nm to about 50 nm, and a thickness of the first work function metal layer is in a range of about 1 nm to about 5 nm.

6. The memory device of claim 1, further comprising a second work function metal layer, disposed between the selector layer and the second electrode.

7. The memory device of claim 1, wherein the first work function metal layer is in direct contact with the selector layer.

8. A memory device, comprising:
   a first electrode;
   a dielectric data storage layer over the first electrode;
   a second electrode over the dielectric data storage layer;
   a selector layer over the second electrode;
   a third electrode over the selector layer; and
   a first work function metal layer, wherein the first work function metal layer is disposed between the selector layer and one of the second electrode and the third electrode, wherein the first work function metal layer comprises a plurality of layers, and a thickness of the layer decreases as the layer becomes closer to the selector layer.

9. The memory device of claim 8, wherein the dielectric data storage layer has a variable resistance.

10. The memory device of claim 8, wherein the first work function metal layer is in direct contact with the selector layer.

11. The memory device of claim 8 further comprising a first barrier layer between the first work function metal layer and the selector layer.

12. The memory device of claim 11, wherein the first barrier layer includes $CaF_2O_4$, $Ce_2O_3$, $LaTi_2O_7$, $ZrO_2$, $CaFe_2O_4$, $YFeO_3$, $Bi_4Ti_3O_{12}$, $K_4Nb_6O_{17}$, $Nb_2O_5$, $Bi_2MoO_4$, $BiVO_4$, $InVO_4$, $BaTiO_3$ or a combination thereof.

13. The memory device of claim 8 further comprising a second work function metal layer disposed between the selector layer and the other of the second electrode and the third electrode.

14. The memory device of claim 13, further comprising a second barrier layer, disposed between the selector layer and the second work function metal layer.

15. A method of forming a memory device, comprising:
   forming a first electrode;
   forming a dielectric data storage layer over the first electrode;
   forming a second electrode over the dielectric data storage layer;
   forming a selector layer over the second electrode;
   forming a third electrode over the selector layer; and
   forming a first work function metal layer between the selector layer and one of the second electrode and the third electrode, wherein the first work function metal layer comprises a plurality of layers, and a work function of the layer increases as the layer becomes closer to the selector layer.

16. The method of claim 15 further comprising forming a first barrier layer between the first work function metal layer and the selector layer.

17. The method of claim 15 further comprising forming a second work function metal layer between the selector layer and the other of the second electrode and the third electrode.

18. The method of claim 17 further comprising forming a second barrier layer between the selector layer and the second work function metal layer.

19. The method of claim 15, wherein the first electrode, the dielectric data storage layer, the second electrode, the selector layer, the third electrode and the first work function metal layer are formed simultaneously by a same patterning process.

20. The memory device of claim 11, wherein a conduction band of the first barrier layer is smaller than a conduction band of the first work function metal layer.

* * * * *